(12) United States Patent
Bechtel et al.

(10) Patent No.: US 8,721,098 B2
(45) Date of Patent: May 13, 2014

(54) LIGHT SCATTERING AND CONVERSION PLATE FOR LEDS

(75) Inventors: Hans-Helmut Bechtel, Eindhoven (NL); Matthias Heidemann, Eindhoven (NL); Peter J. Schmidt, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 356 days.

(21) Appl. No.: 13/320,803

(22) PCT Filed: May 17, 2010

(86) PCT No.: PCT/IB2010/052167
§ 371 (c)(1),
(2), (4) Date: Nov. 16, 2011

(87) PCT Pub. No.: WO2010/134011
PCT Pub. Date: Nov. 25, 2010

(65) Prior Publication Data
US 2012/0069546 A1    Mar. 22, 2012

(30) Foreign Application Priority Data

May 19, 2009   (EP) ..................................... 09160613

(51) Int. Cl.
*F21V 33/00*   (2006.01)

(52) U.S. Cl.
USPC ................ 362/84; 313/498; 313/502; 257/98

(58) Field of Classification Search
USPC .................... 362/84, 500; 313/498, 511–512,
313/110–112, 116, 502, 501, 503; 445/24;
257/98, E33.065, E33.066
See application file for complete search history.

(56) References Cited

U.S. PATENT DOCUMENTS

| | | | |
|---|---|---|---|
| 5,695,809 A | 12/1997 | Chadha et al. | |
| 7,285,791 B2 | 10/2007 | Beeson et al. | |
| 8,415,692 B2 * | 4/2013 | Le Toquin | 257/98 |
| 8,547,009 B2 * | 10/2013 | Hussell et al. | 313/499 |
| 2002/0030444 A1 | 3/2002 | Muller-Mach et al. | |
| 2004/0145308 A1 | 7/2004 | Rossner et al. | |
| 2007/0145884 A1 | 6/2007 | Wu et al. | |
| 2009/0026908 A1 * | 1/2009 | Bechtel et al. | 313/110 |
| 2009/0066221 A1 | 3/2009 | Schmidt et al. | |
| 2009/0160330 A1 * | 6/2009 | Hsu et al. | 313/506 |
| 2010/0165599 A1 * | 7/2010 | Allen | 362/84 |
| 2011/0248623 A1 * | 10/2011 | Ichikawa | 313/483 |

FOREIGN PATENT DOCUMENTS

| | | |
|---|---|---|
| DE | 10349038 A1 | 5/2004 |
| DE | 102006061175 A1 | 6/2008 |
| WO | 2006035353 A2 | 4/2006 |
| WO | 2008007232 A2 | 1/2008 |

* cited by examiner

*Primary Examiner* — Laura Tso

(57) ABSTRACT

The invention relates to an illumination system having a light scattering and conversion plate comprising a non-converting but scattering layer and a thinner converting layer. By separating scattering and conversion, the characteristics of the illumination system can greatly be increased.

11 Claims, 4 Drawing Sheets

LIGHT SCATTERING AND CONVERSION PLATE FOR LEDS

FIELD OF THE INVENTION

The present invention is directed to novel luminescent materials and compounds for light emitting devices, especially to the field of LEDs

BACKGROUND OF THE INVENTION

In recent years, several new techniques and setups have been developed for LEDs, amongst them the introduction of ceramic converter plates and layers. In this regard, reference is made e.g. to the US 2004/145 308 which incorporated by reference.

However, there is still the continuing need for converter plates and layers which show good emitting and scattering properties.

SUMMARY OF THE INVENTION

It is an object of the present invention to provide an illumination system which is usable within a wide range of applications and especially allows the fabrication of warm white pcLEDs with optimized luminous efficiency and color rendering.

This object is solved by an illumination system according to claim 1 of the present invention. Accordingly, an illumination system is proposed comprising at least one light scattering and conversion plate comprising
   a) a first layer having scattering properties and no conversion properties and
   b) a second layer having conversion properties
   whereby the thickness A of the first layer and the thickness B of the second layer match $$A \geq 3*B$$

Preferably A and B match $A \geq 4*B$, more preferred $A \geq 7*B$.

The term "layer" and/or "plate" especially mean and/or include an object which extends in one dimension (i.e. the height) to $\leq 40\%$, more preferred $\leq 20\%$ and most preferred $\leq 10\%$ than in any of the other dimensions (i.e. width and length).

The term "scattering" especially means and/or includes the change of the propagation direction of light.

The term "converting" especially means and/or includes the physical process of absorption of light and emitting of light in another wavelength area, e.g. due to radiative transitions that involve at least one ground state and at least one excited state and that may be described with a configurational coordinate diagram showing the potential energy curves of absorbing and emitting centers as a function of the configurational coordinate.

The term "no conversion properties" especially means and/or includes that $\geq 95\%$, more preferred $\geq 97\%$, more preferred $\geq 98\%$ and most preferred $\geq 99\%$ of all transmitted light passes the plate without being converted.

Such an illumination system has shown for a wide range of applications within the present invention to have at least one of the following advantages:
   The surprising result of one of the basic ideas underlying the present invention, i.e. separating scattering and converting is that for most application both a good forward emission together with an angular stability of the emission profile can be found.
   The overall setup of the illumination system can be kept simple and small
   The lifetime of the illumination system is considerably extended because of improved heat dissipation properties and improved chemical stability
   additional functional layers can be applied on one layer only eliminating the risk of damaging the more expensive other layer.

According to a preferred embodiment, the second layer is in the optical path in between the primary light source and the first layer.

The primary light source will in most applications be a blue LED; however, any devices known in the field to the skilled person in the art may be used.

According to a preferred embodiment, the first and/or second layer are essentially made out of a ceramic material.

The term "essentially" in the sense of the present invention especially means $\geq 90$ (wt.)-%, more preferably $\geq 95$ (wt.)-%, yet more preferably $\geq 98$ (wt.)-% and most preferred $\geq 99$ (wt.)-%.

The term "ceramic material" in the sense of the present invention means and/or includes especially a crystalline or polycrystalline compact material or composite material with a controlled amount of pores or which is pore free.

The term "polycrystalline material" in the sense of the present invention means and/or includes especially a material with a volume density larger than 90 percent of the main constituent, consisting of more than 80 percent of single crystal domains, with each domain being larger than 0.5 µm in diameter and having different crystallographic orientations. The single crystal domains may be connected by amorphous or glassy material or by additional crystalline constituents.

According to a preferred embodiment, the ceramic material has a volume of $\geq 0.005$ mm$^3$ to $\leq 8$ mm$^3$, more preferred $\geq 0.03$ mm$^3$ to $\leq 1$ mm$^3$ and most preferred $\geq 0.08$ mm$^3$ to $\leq 0.18$ mm$^3$.

According to a preferred embodiment, the ceramic material has a density of $\geq 90\%$ and $\leq 100\%$ of the theoretical density. This has been shown to be advantageous for a wide range of applications within the present invention since then the luminescent properties of the at least one ceramic material may be increased.

More preferably the ceramic material has a density of $\geq 97\%$ and $\leq 100\%$ of the theoretical density, yet more preferred $\geq 98\%$ and $\leq 100\%$, even more preferred $\geq 98.5\%$ and $\leq 100\%$ and most preferred $\geq 99.0\%$ and $\leq 100\%$.

According to a preferred embodiment of the present invention, the surface roughness RMS (disruption of the planarity of a surface; measured as the geometric mean of the difference between highest and deepest surface features) of the surface(s) of the ceramic material is $\geq 0.001$ µm and $\leq 0.1$ µm.

According to an embodiment of the present invention, the surface roughness of the surface(s) of the at least one ceramic material is $\geq 0.005$ µm and $\leq 0.8$ µm, according to an embodiment of the present invention $\geq 0.01$ µm and $\leq 0.5$ µm, according to an embodiment of the present invention $\geq 0.02$ µm and $\leq 0.2$ µm and according to an embodiment of the present invention $\geq 0.03$ µm and $\leq 0.15$ µm.

According to a preferred embodiment of the present invention, the specific surface area of the ceramic material is $\geq 10^{-7}$ m$^2$/g and $\leq 0.1$ m$^2$/g.

According to a preferred embodiment, the thickness B of the second layer is $\geq 5$ µm and $\leq 80$ µm. This has been shown to be advantageous for many applications within the present invention since by doing so the packing efficiency and side emission of the light scattering and conversion plate may greatly be increased and reduced, respectively.

Preferably the thickness B of the second layer is ≥10 μm and ≤50 μm.

According to a preferred embodiment, the thickness A of the first layer is ≥50 μm and ≤1000 μm. This has been shown to be advantageous, since by doing so, for many application the scattering features and the uniformity of the light emitting profile of the light scattering and conversion plate may greatly be increased.

Preferably the thickness A of the first layer is ≥100 μm and ≤300 μm.

According to a preferred embodiment, the scattering coefficient of the first layer is >0 and ≤1000 cm$^{-1}$.

The scattering coefficient s is determined by measurement of the reflectance $R_0$ and/or the transmittance $T_0$ of a thin layer with thickness A according to the equations:

$$sA = \frac{1}{b} \text{Arctgh}\left(\frac{1-kR_0}{bR_0}\right)$$

$$sA = \frac{1}{b}\left(A r \sinh\frac{b}{T_0} - A r \sinh b\right)$$

With $b = \sqrt{k^2 - 1}$ and $$k = \frac{s+a}{s}$$

(a is the absorption coefficient of the layer)
In case of a=0 equations simplify to $$sA = \frac{R_0}{1-R_0}$$

$$sA = \frac{1-T_0}{T_0}$$

Preferably the scattering coefficient of the first layer is ≥100 and ≤500 cm$^{-1}$.

According to a preferred embodiment, the mean refractive index n of the first layer is ≥1.3 and ≤2.5.

According to a preferred embodiment, the difference $\Delta_n$ in refractive index between the refractive index of the first layer and the second layer is ≥0.03 and ≤1. This has been shown to be advantageous for mixing the light from the primary light source and the converted light from the second layer for many applications. Preferably $\Delta_n$ is ≥0.3 and ≤0.5.

According to a preferred embodiment, the first layer is essentially made out of a material selected from the group comprising glass, $Al_2O_3$, $Y_3Al_5O_{12}$, $RE_3Al_5O_{12}$ (RE=rare earth metal), $Y_2O_3$, ZnS, AlON, AlPON, AlN, $MgAl_2O_4$, SiC, $SiO_2$, $Si_3N_4$ or mixtures thereof.

According to a preferred embodiment, the second layer is essentially made out of a material selected from the group comprising $Lu_bY_cGd_dCe_eAl_5O_{12}$ with b+c+d+e=3, 0.09≤e≤0.24, $Cai_{1-x-y-z-0.5u}M_xSi_{1+u-v-z}Al_{1-u+v+z}N_{3-v}O_v$: $Eu_y,Ce_z$ with 0≤u<0.2, 0<v<0.05, 0≤x<1, 0.001≤y≤0.01, 0.002≤y≤0.04, and M=Sr, Ba, Mg or mixtures thereof.

According to a preferred embodiment, the plate comprises a third layer provided in between the first and second layer and essentially made out of an adhesive material, preferably a silicone glue.

This invention furthermore relates to method of producing a light scattering and conversion plate comprising the steps of a) Providing a first and second layer, whereby the thickness of the second layer is larger than desired
b) Connecting the first and second layer, optionally by use of a third layer provided in between the first and second layer and essentially made out of an adhesive material
c) Mechanically reducing the thickness of the second layer, e.g. by grinding By doing so, it has been shown for many applications that a light scattering and conversion plate according to the present invention can be made easily and effectfully even for small thicknesses of the second layer.

An illumination system according to the present invention may be of use in a broad variety of systems and/or applications, amongst them one or more of the following:
Office lighting systems
household application systems
shop lighting systems,
home lighting systems,
accent lighting systems,
spot lighting systems,
theater lighting systems,
fiber-optics application systems,
projection systems,
self-lit display systems,
pixelated display systems,
segmented display systems,
warning sign systems,
medical lighting application systems,
indicator sign systems, and
decorative lighting systems
portable systems
automotive applications
green house lighting systems The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

BRIEF DESCRIPTION OF THE DRAWINGS

Additional details, features, characteristics and advantages of the object of the invention are disclosed in the subclaims, the figures and the following description of the respective figures and examples, which—in an exemplary fashion—show several embodiments and examples of a luminescent material for use in an illumination system according to the invention as well as several embodiments and examples of an illumination system according to the invention.

FIG. 1 shows a very schematic setup of an illumination system according to one embodiment of the present invention. Most of FIG. 1 is prior art and known to the skilled person and will therefore described only briefly. It is apparent that the illumination system of FIG. 1 is exemplarily only and the skilled person may use different parts or replace it at lib.

The illumination system 1 comprises a thin film chip blue LED 20 upon which a light scattering and converting plate 10 is provided; both are covered by a lens.

Figure 1:
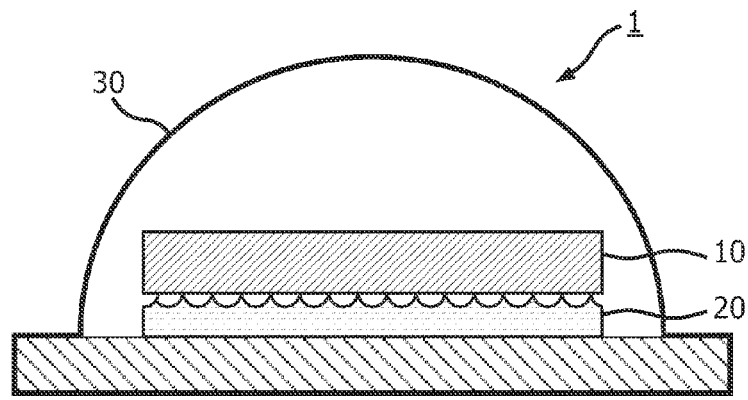
FIG. 1 shows a very schematic setup of an illumination system according to one embodiment of the present invention.
Figure 2:
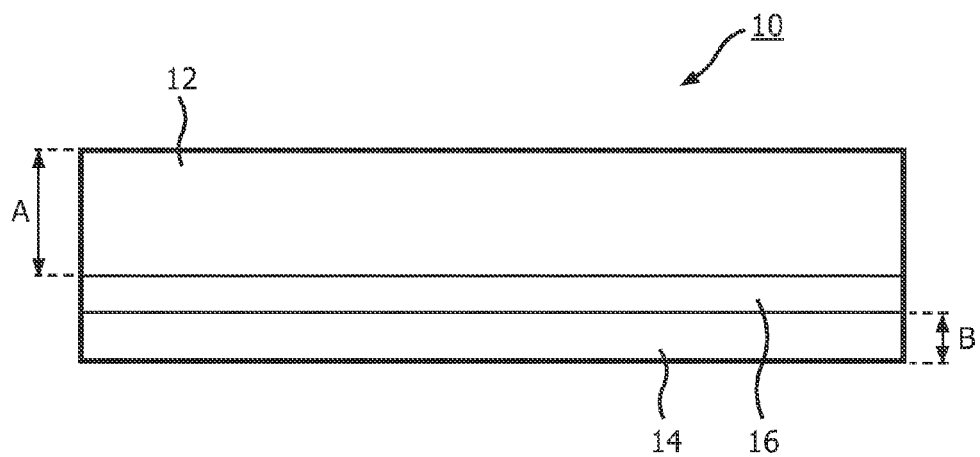
FIG. 2 shows a detailled very schematic view of the light scattering and converting plate of FIG. 1

FIG. 2 shows a detailed very schematic view of the light scattering and converting plate of FIG. 1. The plate 10 comprises a first layer 12 (with a thickness A), a second layer 14 (with a thickness B) and in between a silicon glue layer 16. FIG. 2 is highly schematic and in most applications the actual dimensions will be much different. It is noted that the plate 10 is provided in the illumination system 1 so that the second layer 12 is in the optical path between the blue chip LED 20 and the second layer 14.

The invention will be further understood by the following Examples I and II which—in a merely illustrative fashion—shows several illumination systems of the present invention.

In the examples a $Y_{2.88}Ce_{0.012}Al_5O_{12}$ layer (i.e. the second layer 14) was ground from both sides from a 1.1 mm thick wafer after sintering to 300 μm thickness. Also a 1 mm thick polycrystalline $Al_2O_3$ layer (PCA, the first layer 12) with a mass density of 99.98 percent of the crystalline $Al_2O_3$ was ground to 150 μm. Then the first layer was coated with a Silicone layer (Shin Etsu KJR-9222A and KJR-9222A, mixing ratio 1:1), the second layer was attached and the silicone layer was hardened at a temperature of 100° C. for one hour and cured at 150° C. for 2 hours.

After the gluing, the second layer 14 was further ground to a thickness of 17 (Example I) and ≤30 μm (Example II), respectively.

Then both plates were diced to 0.99×0.99 mm², mount on a blue TFFC LED emitting at about 450 nm and lensed. LED packaging was done in the same was as for Lumiramic phosphor converted LEDs.

Furthermore a comparative Example I was made in analogy to the inventive Examples. In this comparative example, the second layer was set to a thickness of 120 μm and made out of $Y_{2.842}Gd_{0.15}Ce_{0.008}Al_5O_{12}$ (i.e. a lower Cerium-Content to match the higher thickness)

Figure 3:
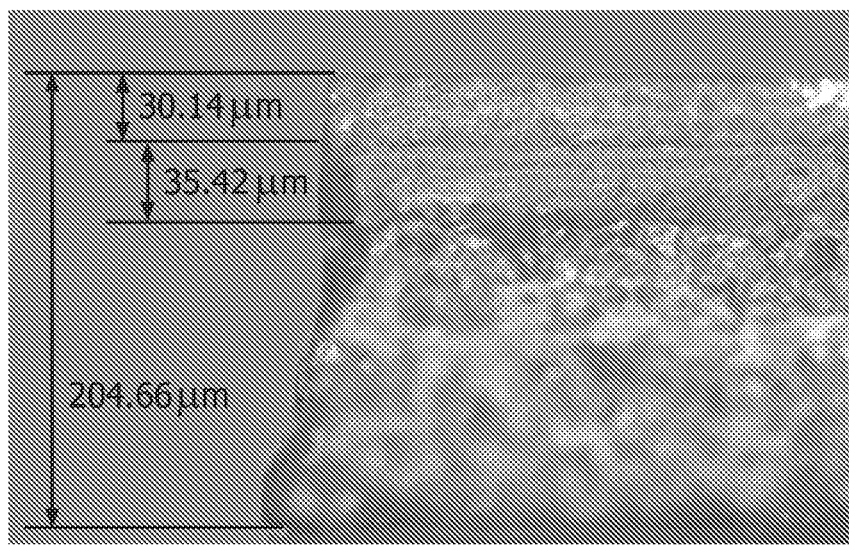
FIG. 3 shows a photograph of a detail of a light scattering and converting plate according to Example I of the present invention.

FIG. 3 shows a photograph of a detail of a light scattering and converting plate according to Example I of the present invention. The light scattering and converting plate has an overall thickness of about 205 μm, whereby the first layer is about 140 μm thick, the second layer about 30 μm and the silicon layer about 35 μm.

Figure 4:
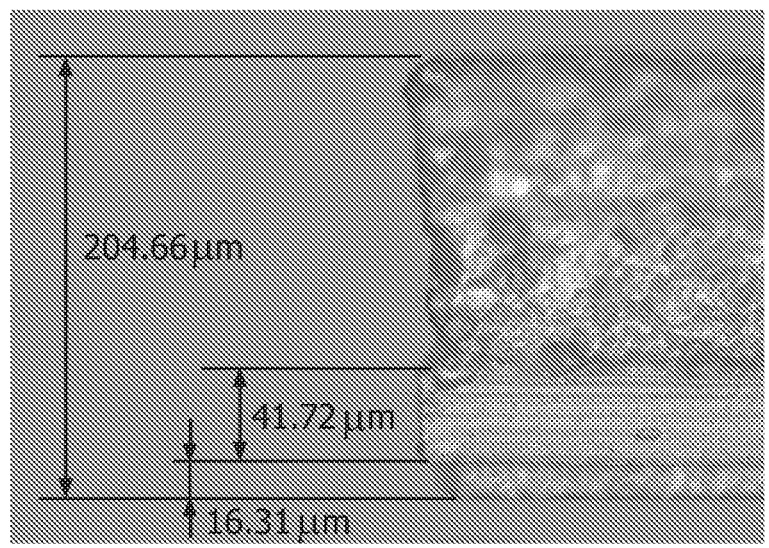
FIG. 4 shows a photograph of a detail of a light scattering and converting plate according to Example II of the present invention.

FIG. 4 shows a photograph of a detail of a light scattering and converting plate according to Example II of the present invention. By chance, the light scattering and converting plate has also an overall thickness of about 205 μm; however, here the first layer is about 146 μm thick, the second layer about 17 μm and the silicon layer about 42 μm.

Figure 5:
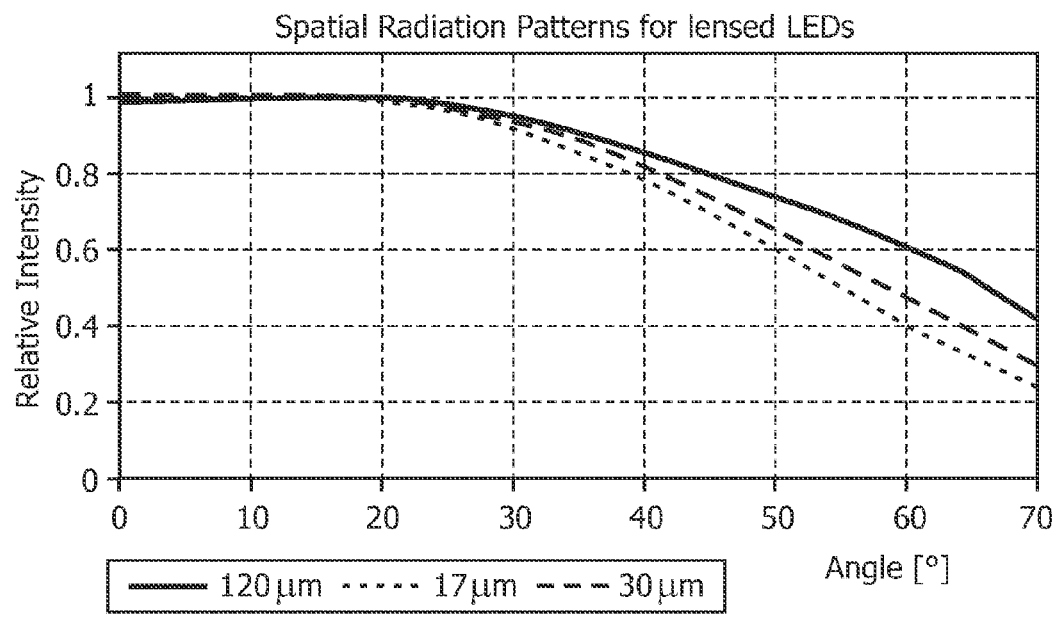
FIG. 5 shows the spatial radiation pattern of two LEDs according to Example I and II of the present invention and a comparative example

FIG. 5 shows the spatial radiation pattern of the two LEDs according to Example I and II of the present invention and a comparative example. Due to emission from the faces of the Lumiramic converter plate of the comparative example the radiative flux under large emission angle is higher compared to the flux under large angles emitted by LEDs with converter plates of Example I and Example II of the present invention.

Figure 6:
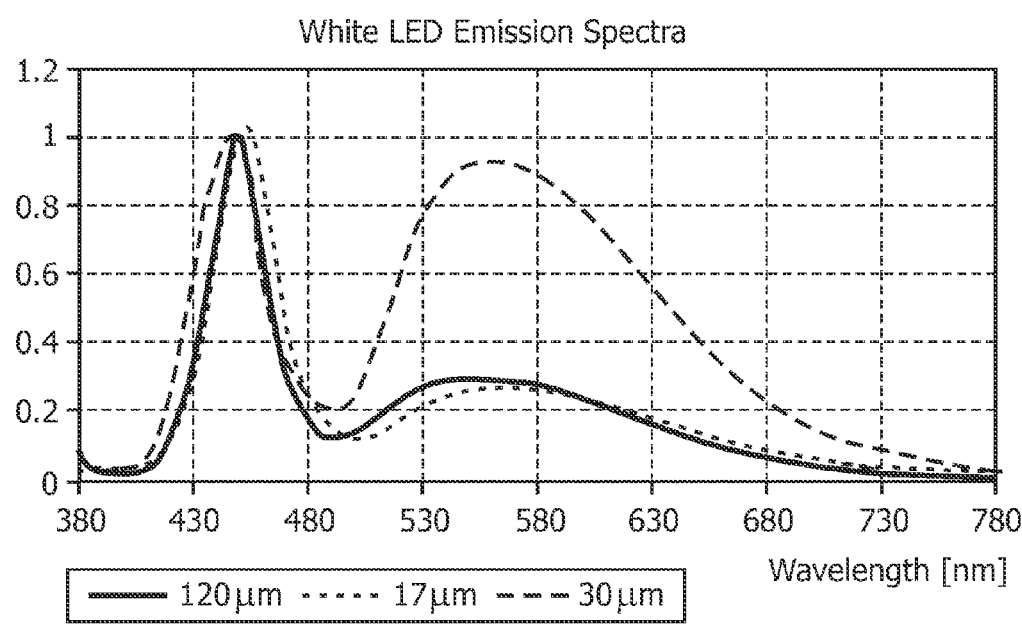
FIG. 6 shows the Emission spectra of the two LEDs according to Example I and II of the present invention and the comparative example.

FIG. 6 shows the Emission spectra of the two LEDs according to Example I and II of the present invention and the comparative example. For the comparative example (120 μm) the total conversion strength is low and the peak of the emitted blue light is much larger than the maximum of the converted light. For the 30 μm Example both peaks are about equal, which shows the high efficacy of the light scattering and conversion plate.

Figure 7:
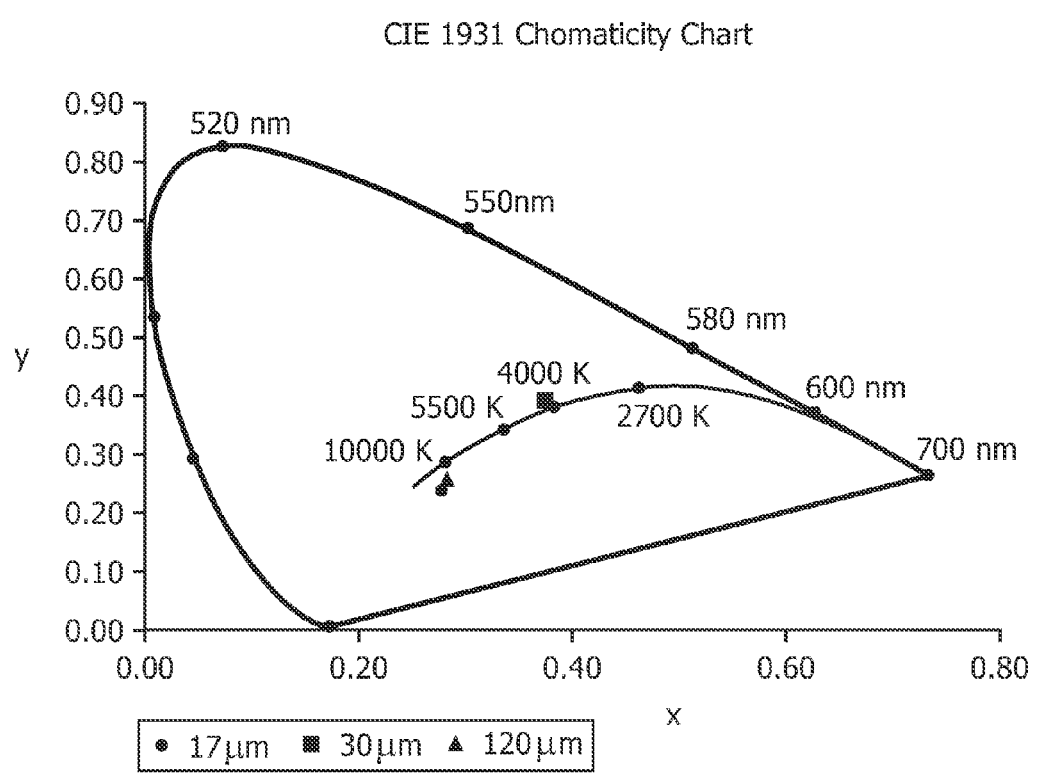
FIG. 7 shows a CIE 1931 Chromaticity chart showing the Planckian locus of the two LEDs according to Example I and II of the present invention and the comparative example

FIG. 7 shows a CIE 1931 Chromaticity chart showing the Planckian locus and the color points of the two LEDs according to the Example I and II of the present invention and the comparative example. It can be seen that due to the inventive scattering and light emitting plate a low color temperature of about 4000K has been realized with the 30 μm Example, whereas only a small change in size of the conversion layer 12 (i.e. to 17 μm) leads to a dramatic increase of color temperature to about 10000K. Variation of thickness and Cerium concentration gives access to white LED production of a color temperature ranging from above 10 000K to 4000K and below.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. The invention's scope is defined in the following claims and the equivalents thereto. Furthermore, reference signs used in the description and claims do not limit the scope of the invention as claimed.

The invention claimed is:

1. An illumination system, comprising at least one light scattering and conversion plate comprising:
  a first layer having scattering properties and essentially no conversion properties and having a thickness A; and
  a second layer having conversion properties and having a thickness B,
  wherein the thickness A of the first layer is greater or equal to three times the thickness B of the second layer.

2. The illumination system according to claim 1, wherein the second layer is in the optical path in between the primary light source and the first layer.

3. The illumination system according to claim 1, wherein the first and/or second layer are essentially made out of a ceramic material.

4. The illumination system according to claim 1, wherein the thickness B of the second layer is ≥5 μm and ≤80 μm.

5. The illumination system according to claim 1, wherein the thickness A of the first layer is ≥50 μm and ≤1000 μm.

6. The illumination system according to claim 1, wherein the scattering coefficient of the first layer A is >0 and ≤1000 $cm^{-1}$.

7. The illumination system according to claim 1 wherein the difference $\Delta_n$ in refractive index between the refractive index of the first layer and the second layer is ≥0.03 and ≤1.

8. The illumination system of any of the claim 1 or 2 wherein the plate comprises a third layer disposed in between the first and second layer, wherein the third layer is comprised of an adhesive material.

9. A method of producing a light scattering and conversion plate according to claim 1, comprising the steps of
   Providing a first and second layer, whereby wherein the second layer has a first thickness;
   Connecting the first and second layer;
   reducing the thickness of the second layer to a second thickness.

10. A system comprising the illumination system according to claim 1, the system being used in one or more of the following applications:
    office lighting systems
    household application systems
    shop lighting systems,
    home lighting systems,
    accent lighting systems,
    spot lighting systems,
    theatre lighting systems,
    fiber-optics application systems,
    projection systems,
    self-lit display systems,
    pixelated display systems,
    segmented display systems,
    warning sign systems,
    medical lighting application systems,
    indicator sign systems, and
    decorative lighting systems
    portable systems
    automotive applications
    green house lighting systems.

11. The method of claim 9 wherein the first layer and the second layer are connected by a third layer comprised of an adhesive material disposed between the first layer and the second layer.

* * * * *